United States Patent
Goto et al.

(10) Patent No.: US 11,610,873 B2
(45) Date of Patent: Mar. 21, 2023

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Ryo Goto, Tokyo (JP); Takami Otsuki, Tokyo (JP); Yasutaka Shimizu, Tokyo (JP); Shingo Tomioka, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 91 days.

(21) Appl. No.: 17/078,599

(22) Filed: Oct. 23, 2020

(65) Prior Publication Data

US 2021/0249389 A1 Aug. 12, 2021

(30) Foreign Application Priority Data

Feb. 10, 2020 (JP) .............................. JP2020-020476

(51) Int. Cl.
*H01L 25/16* (2006.01)
*H01L 23/00* (2006.01)
*H01L 21/66* (2006.01)

(52) U.S. Cl.
CPC .............. *H01L 25/16* (2013.01); *H01L 22/12* (2013.01); *H01L 24/32* (2013.01); *H01L 24/48* (2013.01);
(Continued)

(58) Field of Classification Search
CPC ... H01L 2924/10272; H01L 2924/1205; H01L 2924/1207; H01L 2924/13055;
(Continued)

(56) References Cited

U.S. PATENT DOCUMENTS

| 2007/0132080 A1 | 6/2007 | Nakashima et al. |
| 2009/0065922 A1 | 3/2009 | Nakashima et al. |
| 2020/0006237 A1* | 1/2020 | Nakano ............... H01L 23/5389 |

FOREIGN PATENT DOCUMENTS

| JP | 2005-123542 A | 5/2005 |
| JP | 2020-004929 A | 1/2020 |

(Continued)

OTHER PUBLICATIONS

An Office Action; "Notice of Reasons for Refusal," mailed by the Japanese Patent Office dated Jan. 31, 2023, which corresponds to Japanese Patent Application No. 2020-020476 and is related to U.S. Appl. No. 17/078,599; with English language translation.

*Primary Examiner* — Shaun M Campbell
(74) *Attorney, Agent, or Firm* — Studebaker & Brackett PC

(57) ABSTRACT

An object of the present disclosure is to provide a semiconductor device capable of confirming withstand voltage of a snubber circuit after providing the snubber circuit and a method of manufacturing the semiconductor device. A semiconductor device according to the present disclosure includes: an insulating substrate; a circuit patterns provided on the insulating substrate; a snubber circuit substrate provided on the insulating substrate separately from the circuit patterns; a resistance provided on one of the circuit patterns and the snubber circuit substrate; a capacitor provided on another one of the circuit patterns and the snubber circuit substrate; and at least one semiconductor element electrically connected to the resistance and the capacitor.

7 Claims, 6 Drawing Sheets

(52) U.S. Cl.
CPC .... *H01L 24/73* (2013.01); *H01L 2224/32155* (2013.01); *H01L 2224/48225* (2013.01); *H01L 2224/73265* (2013.01); *H01L 2924/10272* (2013.01); *H01L 2924/1205* (2013.01); *H01L 2924/1207* (2013.01); *H01L 2924/13055* (2013.01); *H01L 2924/13091* (2013.01); *H01L 2924/14252* (2013.01)

(58) Field of Classification Search
CPC . H01L 2924/13091; H01L 2924/14252; H01L 2224/32155; H01L 2224/48225; H01L 2224/73265; H01L 24/32; H01L 24/48; H01L 24/73; H01L 22/12; H01L 25/16
See application file for complete search history.

(56) References Cited

FOREIGN PATENT DOCUMENTS

| WO | WO-2018143429 A1 | * | 8/2018 | ............. H01G 2/065 |
| WO | 2018-194153 A1 | | 10/2018 | |

* cited by examiner

F I G. 2
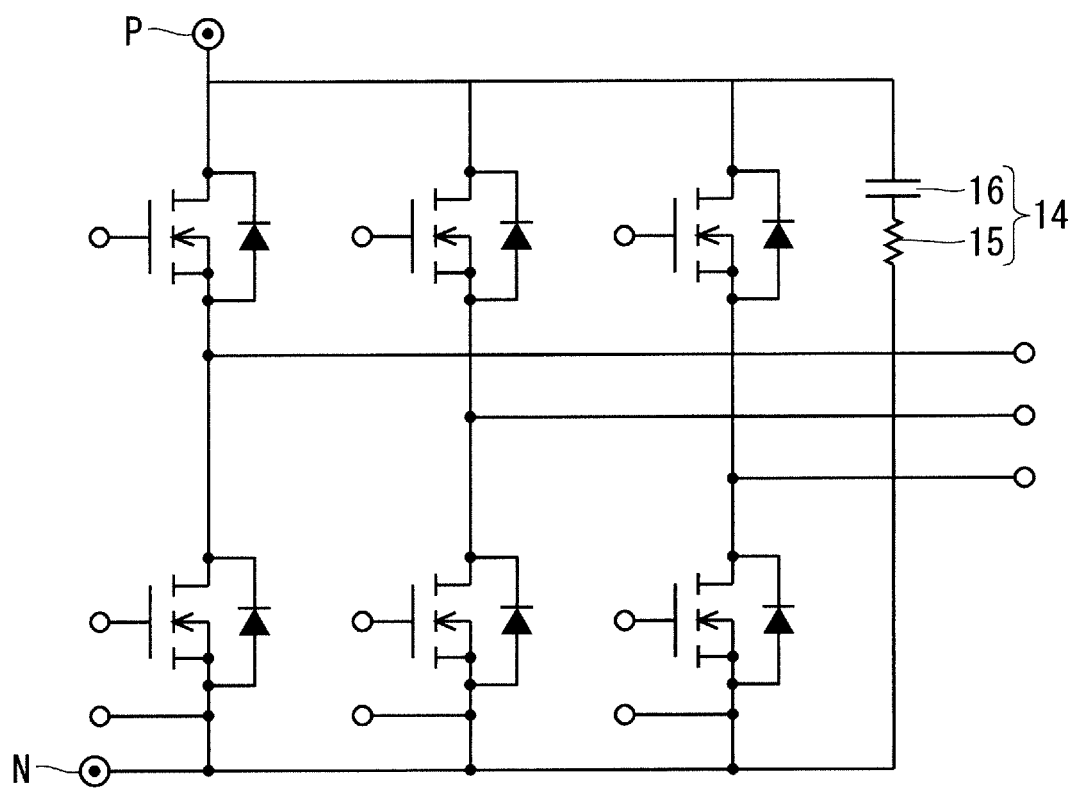

SEMICONDUCTOR DEVICE AND METHOD OF MANUFACTURING SEMICONDUCTOR DEVICE

BACKGROUND OF THE INVENTION

Field of the Invention

The present disclosure relates to a semiconductor device and a method of manufacturing a semiconductor device.

Description of the Background Art

A semiconductor device is used in various situations such as effective energy usage and generation in generating and supplying electrical power. Conventionally disclosed is a technique of reducing ringing occurring in a switching operation of a switching element constituting a semiconductor device (for example, refer to International publication No. 2018/194153).

SUMMARY

International publication No. 2018/194153 discloses a technique relating to a module configuration having a snubber circuit in which a capacitor and a resistance element are connected in series on a conductive pattern provided on a base insulating substrate. However, the snubber circuit is provided on the conductive pattern having the same potential as a P electrode and an N electrode, thus there is a problem that withstand voltage of the snubber circuit itself cannot be confirmed after providing the snubber circuit.

International publication No. 2018/194153 discloses a technique in which a snubber circuit is made up as a single body of component having a resistance film on a ceramic plate. However, the ceramic plate is provided on the conductive pattern having the same potential as one of a P electrode and an N electrode, thus there is a problem that withstand voltage of the snubber circuit itself cannot be confirmed.

An object of the present disclosure is to provide a semiconductor device in which withstand voltage of a snubber circuit can be confirmed after providing the snubber circuit and a method of manufacturing the semiconductor device.

A semiconductor device according to the present disclosure includes: an insulating substrate; a circuit pattern provided on the insulating substrate; a snubber circuit substrate provided on the insulating substrate separately from the circuit pattern; a resistance provided on one of the circuit pattern and the snubber circuit substrate; a capacitor provided on another one of the circuit pattern and the snubber circuit substrate; and at least one semiconductor element electrically connected to the resistance and the capacitor.

According to the present disclosure, the semiconductor device includes: the circuit pattern provided on the insulating substrate; the snubber circuit substrate provided on the insulating substrate separately from the circuit pattern; the resistance provided on one of the circuit pattern and the snubber circuit substrate; and the capacitor provided on another one of the circuit pattern and the snubber circuit substrate. Thus, withstand voltage of the snubber circuit can be confirmed after providing the snubber circuit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a drawing illustrating an example of a circuit for implementing a dielectric voltage-withstand test of the semiconductor device according to the embodiment 1.

DESCRIPTION OF THE PREFERRED EMBODIMENTS

Embodiments of the present disclosure are described hereinafter using the drawings.

Embodiment 1

Figure 1:
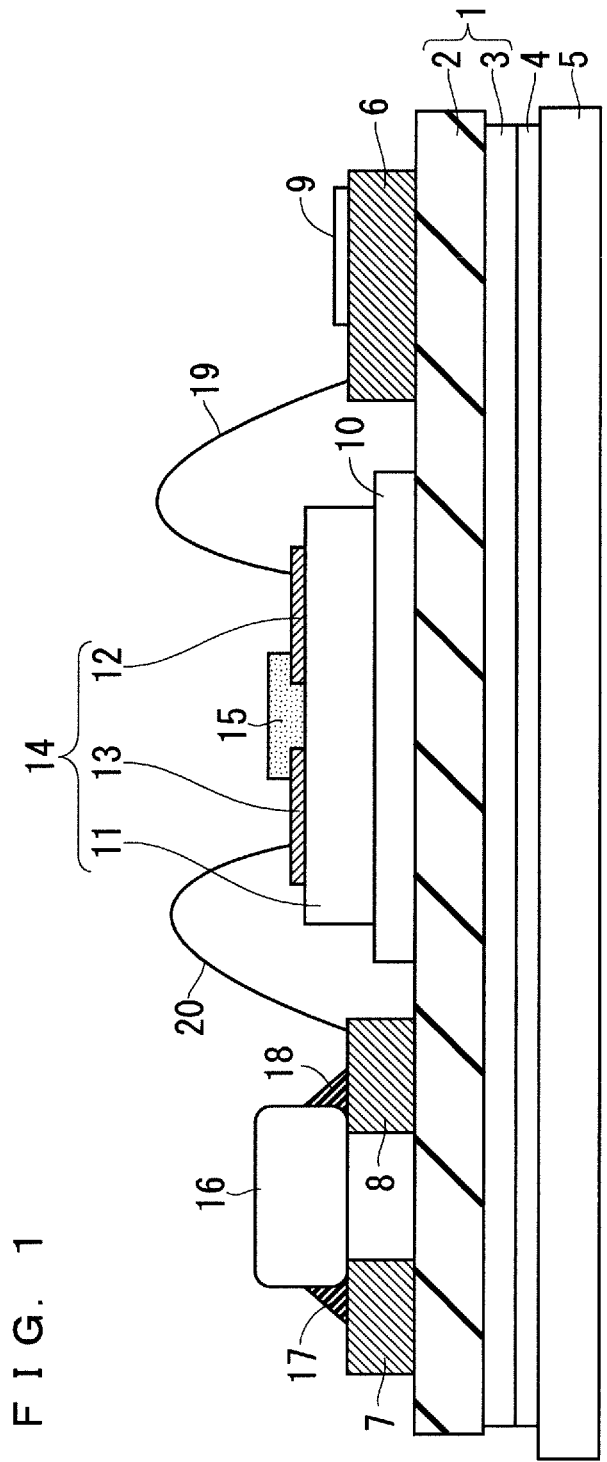
FIG. 1 is a cross-sectional view illustrating an example of a configuration of a semiconductor device according to an embodiment 1.

FIG. 1 is a cross-sectional view illustrating an example of a configuration of a semiconductor device according to the present embodiment 1.

As illustrated in FIG. 1, the semiconductor device includes an insulating substrate 1, a base plate 5, a P-side circuit pattern 6, an N-side circuit pattern 7, a circuit pattern 8, a semiconductor element 9, a snubber circuit substrate 14, a resistance 15, and a capacitor 16. The P-side circuit pattern 6, the N-side circuit pattern 7, and the circuit pattern 8 are also collectively referred to as a circuit pattern.

The semiconductor device may further include a case surrounding each constituent element described above, and may further include a resin filling the case.

The insulating substrate 1 includes an insulating layer 2 and a metal pattern 3. The insulating layer 2 may be ceramic, for example. The metal pattern 3 is located on a lower surface of the insulating layer 2.

The base plate 5 is joined to the metal pattern 3 via a joining material 4. The joining material 4 is made up of solder, for example. The base plate 5 is made of copper, for example.

The P-side circuit pattern 6, the N-side circuit pattern 7, and the circuit pattern 8 are located separately from each other on the insulating layer 2 of the insulating substrate 1. The semiconductor element 9 is located on the P-side circuit pattern 6. One end of the capacitor 16 is electrically connected to the N-side circuit pattern 7 via a joining material 17, and the other end thereof is electrically connected to the circuit pattern 8 via a joining material 18.

A snubber circuit substrate 14 is joined onto the insulating layer 2 of the insulating substrate 1 via a joining material 10. The joining material 10 is made up of a silicon-series material, for example, and contains silicon. The snubber circuit substrate 14 is located separately from each of the P-side circuit pattern 6, the N-side circuit pattern 7, and the circuit pattern 8.

The snubber circuit substrate 14 includes an insulating layer 11 and snubber circuit patterns 12 and 13. The insulating layer 11 may be ceramic, for example. The snubber circuit patterns 12 and 13 are located on the insulating layer 11. One end of the resistance 15 is electrically connected to the snubber circuit pattern 12, and the other end thereof is electrically connected to the snubber circuit pattern 13.

A wiring 19 electrically connects the P-side circuit pattern 6 and the snubber circuit pattern 12. A wiring 20 electrically connects the circuit pattern 8 and the snubber circuit pattern 13.

In the semiconductor device illustrated in FIG. 1, the resistance 15 and the capacitor 16 constitute the snubber circuit. The snubber circuit may substantially include a resistance element and a capacitor, thus a configuration thereof is not limited to a configuration illustrated in FIG. 1. For example, the resistance 15 and the capacitor 16 may be located in positions opposite to the configuration illustrated in FIG. 1. In this case, one end of the resistance 15 is electrically connected to the N-side circuit pattern 7 via the joining material 17, and the other end thereof is electrically connected to the circuit pattern 8 via the joining material 18. One end of the capacitor 16 is electrically connected to the snubber circuit pattern 12, and the other end thereof is electrically connected to the snubber circuit pattern 13.

As described above, the semiconductor element 9 is electrically connected to the snubber circuit. Accordingly, noise occurring in switching the semiconductor element 9 can be removed by the snubber circuit. The semiconductor element 9 is at least one of a metal oxide semiconductor field effect transistor (MOSFET), an insulated gate bipolar transistor (IGBT), a Schottky barrier diode (SBD), and a PN diode for example. The semiconductor element 9 may be one of these elements, and may be a circuit with combination of these elements. In the description as an example hereinafter, the semiconductor element 9 is an inverter having an upper arm and a lower arm.

The semiconductor element 9 is located on the P-side circuit pattern 6, however, the configuration is not limited thereto. For example, the semiconductor element 9 may be located on the N-side circuit pattern 7. In the example in FIG. 1, the semiconductor element 9 is electrically connected to the snubber circuit via the P-side circuit pattern 6 and the wiring 19, but may also be electrically connected to the snubber circuit via a constituent element other than the P-side circuit pattern 6 and the wiring 19.

FIG. 2 is a drawing illustrating an example of a circuit for implementing a dielectric voltage-withstand test of the semiconductor device according to the present embodiment 1. Specifically, the dielectric voltage-withstand test is a dielectric voltage-withstand test of a ground of a semiconductor module including the semiconductor device according to the present embodiment 1, and more specifically, a test of inspecting withstand voltage of the snubber circuit. When the test is implemented, a P electrode and an N electrode have the same potential, and the P-side circuit pattern 6 and the N-side circuit pattern 7 also have the same potential.

Herein, a semiconductor device relating to the semiconductor device according to the present embodiment 1 (referred to as "related semiconductor device" hereinafter) is described.

Figure 3:
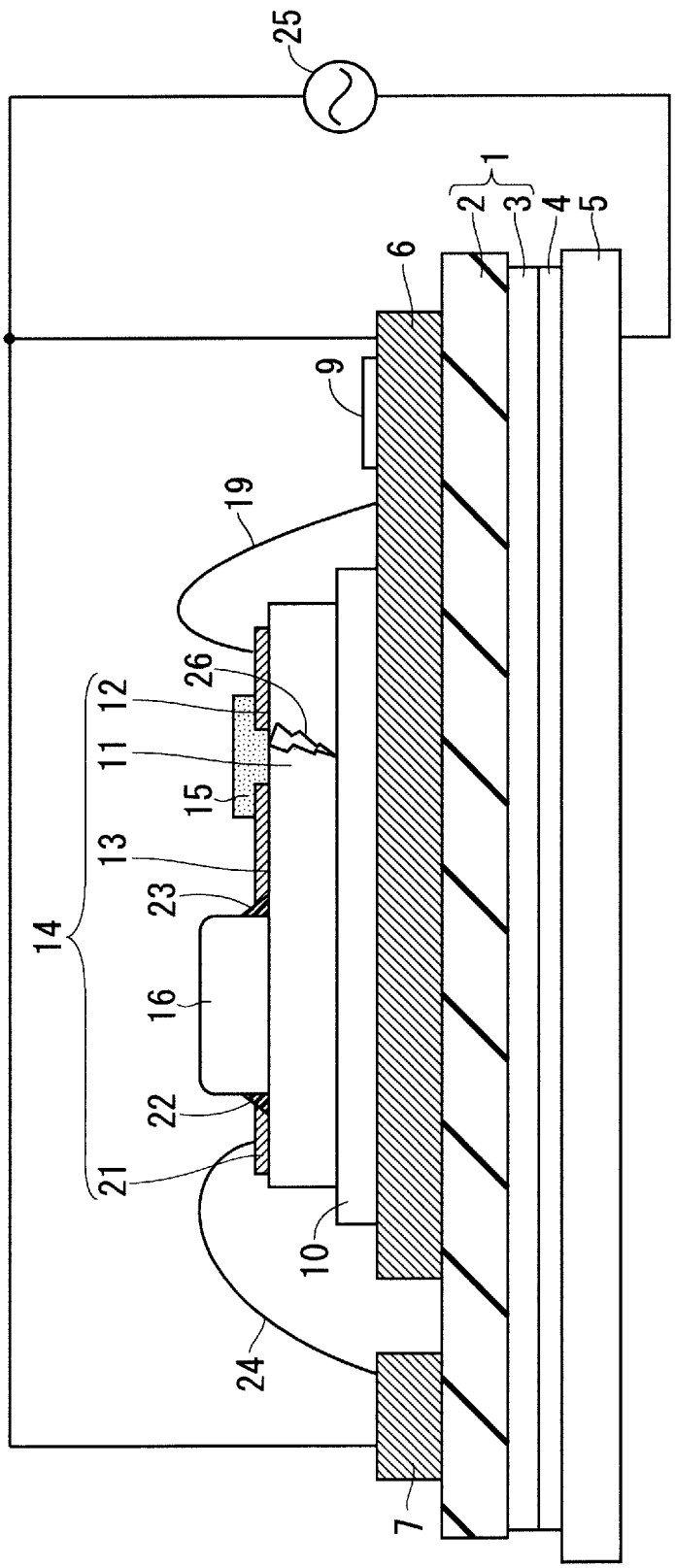
FIG. 3 is a cross-sectional view illustrating a configuration of a related semiconductor device.

FIG. 3 is a cross-sectional view illustrating a configuration of a related semiconductor device. The same reference numerals as those described in the present embodiment 1 will be assigned to the same or similar constituent element in the related semiconductor device illustrated in FIG. 3, and the different constituent elements are mainly described hereinafter.

As illustrated in FIG. 3, in the related semiconductor device, the P-side circuit pattern 6 extends in a planar surface direction, and the snubber circuit substrate 14 is joined to the extension part by the joining material 10 such as solder. One end of an alternating-current source 25 is connected to the P-side circuit pattern 6 and the N-side circuit pattern 7, and the other end thereof is connected to the base plate 5.

When the dielectric voltage-withstand test is performed in a case where a crack 26 illustrated in FIG. 3 does not occur in the insulating layer 11 of the snubber circuit substrate 14, electrical characteristics between the P-side circuit pattern 6 and the base plate 5 and between the N-side circuit pattern 7 and the base plate 5 are detected. In the meanwhile, even in a case where the crack 26 illustrated in FIG. 3 occurs in the insulating layer 11 of the snubber circuit substrate 14 and the snubber circuit is short-circuited to the P-side circuit pattern 6, the snubber circuit is located on an opposite side of the P-side circuit pattern 6 from the base plate 5, thus when the dielectric voltage-withstand test is performed, electrical characteristics between the P-side circuit pattern 6 and the base plate 5 and between the N-side circuit pattern 7 and the base plate 5 are detected. In this manner, in the related semiconductor device illustrated in FIG. 3, the electrical characteristics detected in the dielectric voltage-withstand test does not change depending on the occurrence of the crack 26 in the insulating layer 11 of the snubber circuit substrate 14. Accordingly, in the related semiconductor device illustrated in FIG. 3, the occurrence of the crack 26 in the insulating layer 11 of the snubber circuit substrate 14 cannot be detected, and furthermore, withstand voltage of the snubber circuit substrate 14 cannot be detected.

In the meanwhile, in the semiconductor device illustrated in FIG. 1 according to the present embodiment 1, the snubber circuit substrate 14, the P-side circuit pattern 6, the N-side circuit pattern 7, and the circuit pattern 8 are located separately from each other on the insulating layer 2 of the insulating substrate 1. When the dielectric voltage-withstand test is performed in such a configuration, the electrical characteristics between the P-side circuit pattern 6 and the base plate 5, between the N-side circuit pattern 7 and the base plate 5, and between the snubber circuit substrate 14 and the base plate 5 are detected. The detected electrical characteristics changes depending on the occurrence of the crack in the insulating layer 11 of the snubber circuit substrate 14. Accordingly, in the semiconductor device illustrated in FIG. 1 according to the present embodiment 1, the occurrence of the crack in the insulating layer 11 of the snubber circuit substrate 14 can be detected after providing the snubber circuit, and furthermore, withstand voltage of the snubber circuit substrate 14 can be detected. Accordingly, the withstand voltage of the snubber circuit constituting the resistance 15 and the capacitor 16 can be detected, thus outflow of a defective product of semiconductor device can be prevented and increase in quality of the semiconductor device can be expected.

As illustrated in FIG. 1, the resistance 15 is provided on the snubber circuit substrate 14 and the capacitor 16 is provided the N-side circuit pattern 7 and the circuit pattern 8 to each separate them. Accordingly, a degree of freedom of a layout for the configuration of the snubber circuit is increased, and downsizing of the semiconductor device or increase in capacity of the semiconductor device can be achieved while maintaining a size thereof.

The semiconductor element 9 may contain silicon carbide (SiC). The semiconductor device in which the semiconductor element 9 contains silicon carbide can operate in a high-temperature environment compared with the semiconductor device in which the semiconductor element 9 contains silicon (Si). The semiconductor device in which the semiconductor element 9 contains silicon carbide has a problem that ringing significantly occurs at a time of switching operation. In contrast, according to the semiconductor device according to the present embodiment 1, the occurrence of ringing can be reduced by the snubber circuit.

Steps 1 to 3 described below may be implemented in a process of manufacturing the semiconductor device. The resistance may be replaced with a capacitor in Steps 1 to 3.

In Step 1, the dielectric voltage-withstand test is implemented on a single body of the snubber circuit substrate 14 provided with the resistance. Next, in Step 2, the snubber circuit substrate 14 is provided on the insulating substrate 1, the snubber circuit substrate 14 and the P-side circuit pattern 6 are electrically connected via the wiring 19, and the snubber circuit substrate 14 and the circuit pattern 8 are electrically connected via the wiring 20. Next, in Step 3, the dielectric voltage-withstand test is implemented on the snubber circuit after completing the semiconductor device.

Steps 1 to 3 described above are implemented, thus an inspection accuracy of insulating resistance of the snubber circuit is further increased, and increase in quality of the semiconductor device can be expected.

Embodiment 2

Figure 4:
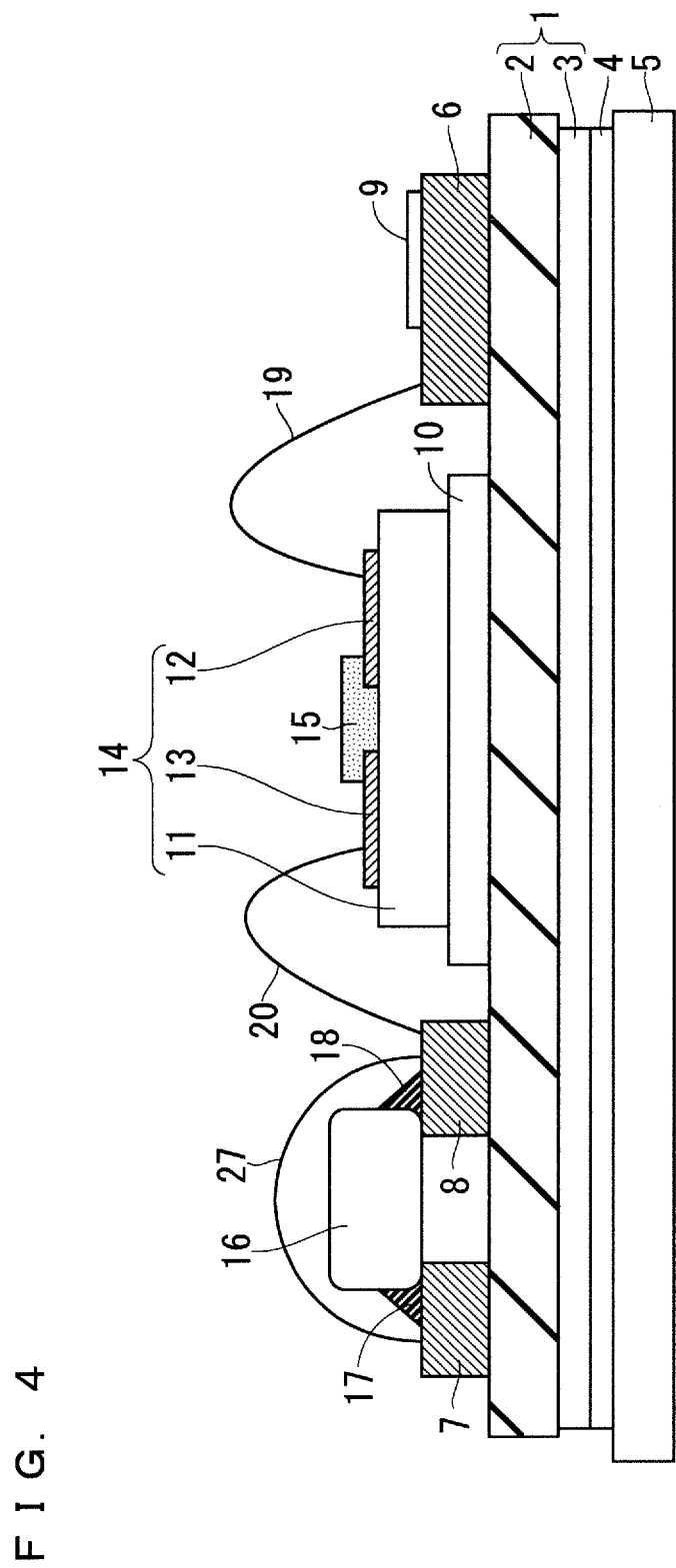
FIG. 4 is a cross-sectional view illustrating an example of a configuration of a semiconductor device according to an embodiment 2.
Figure 5:
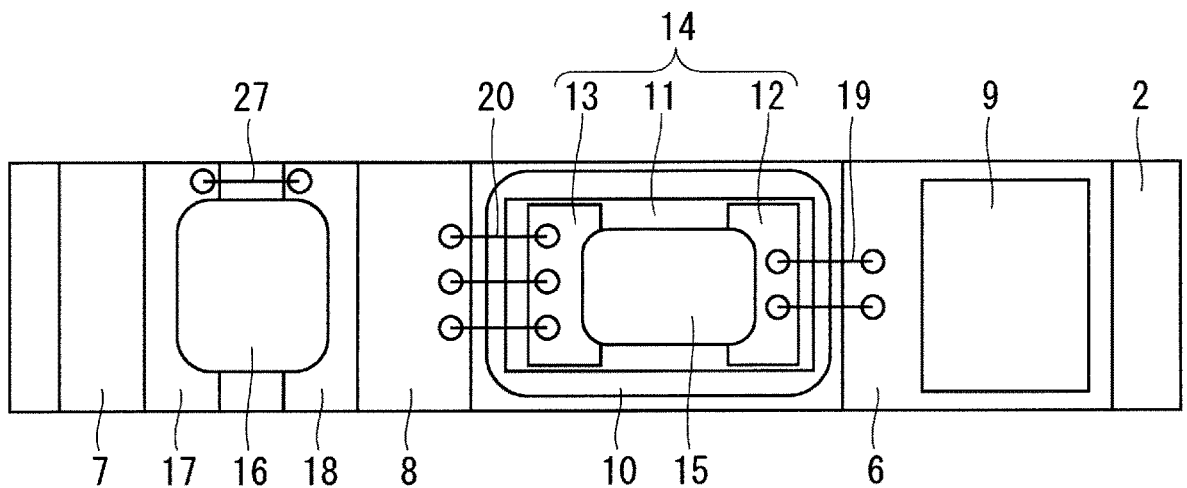
FIG. 5 is a plan view of the semiconductor device illustrated in FIG. 4.

FIG. 4 is a cross-sectional view illustrating an example of a configuration of a semiconductor device according to the present embodiment 2. FIG. 5 is a plan view of the semiconductor device illustrated in FIG. 4.

As illustrated in FIGS. 4 and 5, the semiconductor device according to the present embodiment 2 has characteristics that a wiring 27 is located in parallel to the capacitor 16 located on the N-side circuit pattern 7 and the circuit pattern 8. The other configuration is similar to that of the semiconductor device according to the embodiment 1 illustrated in FIG. 1, thus the detailed description is omitted herein.

One end of the wiring 27 is connected to the N-side circuit pattern 7, and the other end thereof is connected to the circuit pattern 8.

According to the configuration illustrated in FIGS. 4 and 5, potential, which is the same as that in the P-side circuit pattern 6 and the N-side circuit pattern 7 can be applied to the circuit pattern 8 to which the capacitor 16 is connected at the time of the dielectric voltage-withstand test described in the embodiment 1, and withstand voltage of the snubber circuit can be more reliably confirmed. Accordingly, further increase in quality of the semiconductor device can be expected.

The wiring 27 is fused and cut with energizing current at a time of conducting current to the semiconductor element 9 after implementing the dielectric voltage-withstand test.

Described above is the configuration that the capacitor 16 is provided on the N-side circuit pattern 7 and the circuit pattern 8 and the resistance 15 is provided on the snubber circuit substrate 14, however, the configuration is not limited thereto. For example, the effect similar to that described above can be obtained by a configuration that the resistance 15 is provided on the N-side circuit pattern 7 and the circuit pattern 8 and the capacitor 16 is provided on the snubber circuit substrate 14.

Embodiment 3

Figure 6:
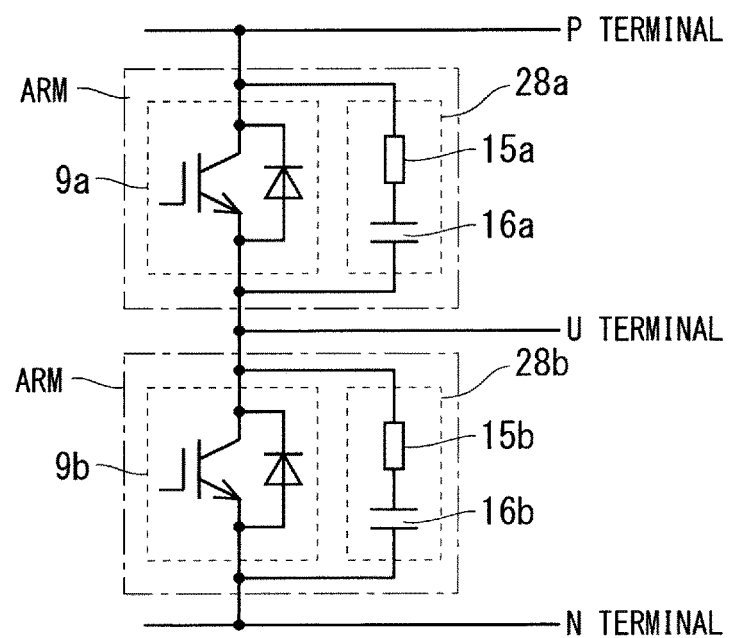
FIG. 6 is a drawing illustrating an example of a circuit constituting a semiconductor device according to an embodiment 3.
Figure 7:
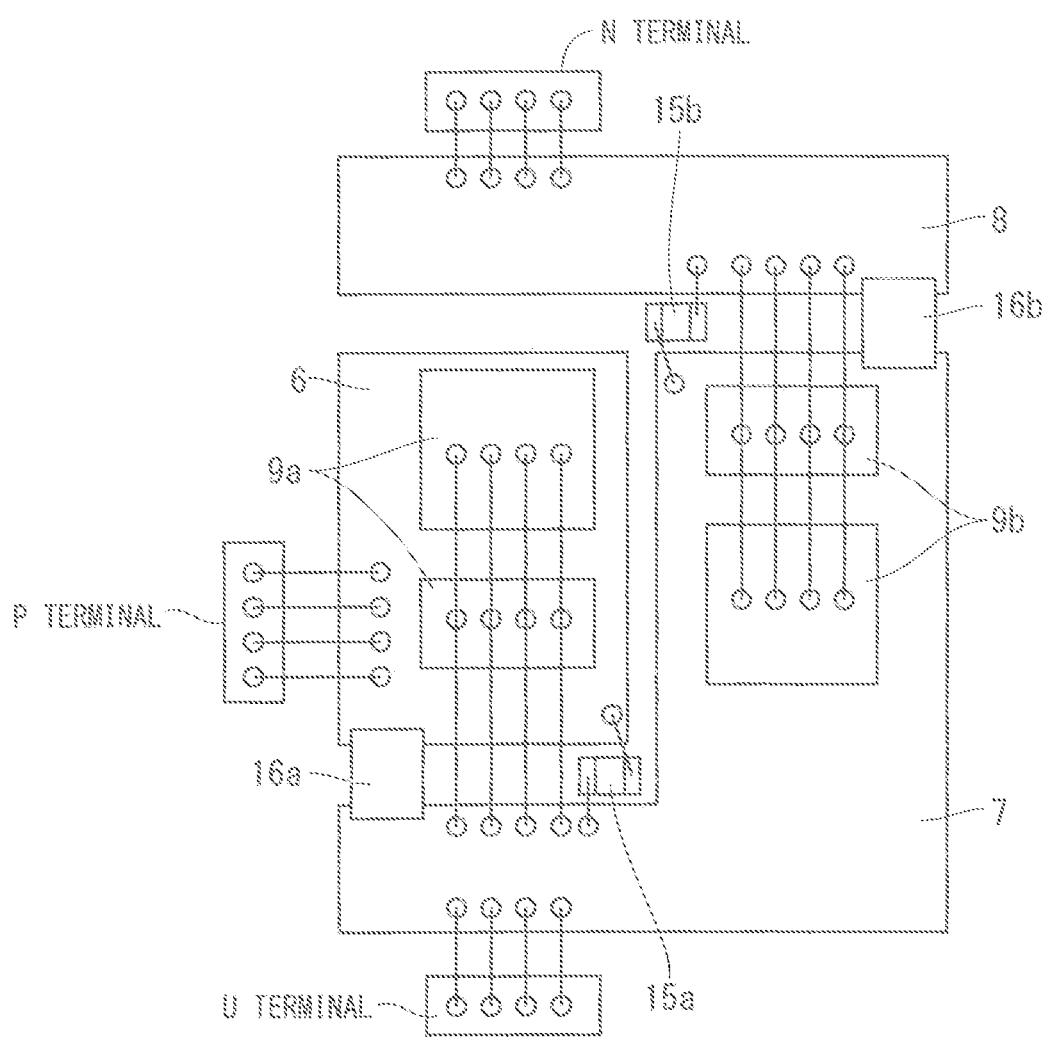
FIG. 7 is a plan view of the semiconductor device illustrated in FIG. 6.

FIG. 6 is a drawing illustrating an example of a circuit constituting a semiconductor device according to the present embodiment 3. FIG. 7 is a plan view of the semiconductor device illustrated in FIG. 6.

As illustrated in FIGS. 6 and 7, the semiconductor device according to the present embodiment 3 has characteristics that a snubber circuit is not provided between a P terminal and an N terminal but is provided in each arm. The other configuration is similar to that in the embodiment 1, thus the detailed description is omitted herein.

As illustrated in FIG. 6, a semiconductor element 9a and a snubber circuit 28a are connected in parallel to each other between a P terminal and a U terminal. The snubber circuit 28a is made up of a resistance 15a and a capacitor 16a. A semiconductor element 9b and a snubber circuit 28b are connected in parallel to each other between a U terminal and an N terminal. The snubber circuit 28b is made up of a resistance 15b and a capacitor 16b. That is to say, the snubber circuit 28a is provided in an upper arm and the snubber circuit 28b is provided in a lower arm. According to such a configuration, the snubber circuits 28a and 28b can be provided in positions closer to each other in the semiconductor elements 9a and 9b, thus the effect of further reducing the ringing can be achieved.

When the snubber circuit is provided in each arm, a space for constituting the snubber circuit is limited due to a structure of a circuit pattern. However, according to the semiconductor device in the present embodiment 3 illustrated in FIG. 7, the resistances 15a and 15b constituting the snubber circuits 28a and 28b are located in the positions away from the P-side circuit pattern 6, the N-side circuit pattern 7, and the circuit pattern 8 on the insulating substrate 1, thus the degree of freedom of the layout can be increased and the snubber circuit can be provided in a narrow space. In this case, the capacitors 16a and 16b constituting the snubber circuit can be provided on an already-existing circuit pattern (the P-side circuit pattern 6, the N-side circuit pattern 7, and the circuit pattern 8).

According to the disclosure, each embodiment can be arbitrarily combined, or each embodiment can be appropriately varied or omitted within the scope of the disclosure.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   an insulating substrate;
   a circuit pattern provided on the insulating substrate;
   a snubber circuit substrate provided on the insulating substrate and non-overlapping in plan view from the circuit pattern;
   a resistance provided on one of the circuit pattern and the snubber circuit substrate;
   a capacitor provided on another one of the circuit pattern and the snubber circuit substrate; and
   at least one semiconductor element electrically connected to the resistance and the capacitor, wherein
   the snubber circuit substrate comprises an insulating layer joined to the insulating substrate.

2. The semiconductor device according to claim 1, wherein
   the resistance is provided on the snubber circuit substrate, and
   the capacitor is provided on the circuit pattern.

3. A semiconductor device, comprising:
   an insulating substrate;
   a circuit pattern provided on the insulating substrate;
   a snubber circuit substrate provided on the insulating substrate separately from the circuit pattern;

a resistance provided on one of the circuit pattern and the snubber circuit substrate;
a capacitor provided on another one of the circuit pattern and the snubber circuit substrate;
at least one semiconductor element electrically connected to the resistance and the capacitor; and
a wiring provided in the circuit pattern in parallel to the resistance or the capacitor provided in the circuit pattern.

4. The semiconductor device according to claim 1, wherein
the plurality of semiconductor elements are included, and
the resistance and the capacitor are connected to the at least one semiconductor element.

5. The semiconductor device according to claim 1, wherein
the semiconductor element contains silicon carbide.

6. The semiconductor device according to claim 1, wherein
the snubber circuit substrate includes a snubber circuit pattern provided on the insulating layer, and
the resistance or the capacitor is provided on the snubber circuit pattern.

7. A method of manufacturing a semiconductor device comprising an insulating substrate, a circuit pattern provided on the insulating substrate, a snubber circuit substrate provided on the insulating substrate separately from the circuit pattern, a resistance provided on one of the circuit pattern and the snubber circuit substrate, a capacitor provided on another one of the circuit pattern and the snubber circuit substrate, and at least one semiconductor element electrically connected to the resistance and the capacitor, the method comprising steps of:

(a) implementing a dielectric voltage-withstand test on a single body of the snubber circuit substrate in which the resistance or the capacitor is provided;

(b) after the step (a), providing the snubber circuit substrate on the insulating substrate, and electrically connecting the snubber circuit substrate and the circuit pattern; and (c) after the step (b), implementing a dielectric voltage-withstand test on a snubber circuit made up of the resistance and the capacitor.

* * * * *